United States Patent [19]
Le Roux et al.

[11] Patent Number: 5,315,249
[45] Date of Patent: May 24, 1994

[54] STABILIZED FAST SPIN ECHO NMR PULSE SEQUENCE

[75] Inventors: Patrick L. Le Roux, Gif/Yvette, France; Richard S. Hinks, Waukesha, Wis.

[73] Assignee: General Electric Company, Milwaukee, Wis.

[21] Appl. No.: 920,952

[22] Filed: Jul. 28, 1992

[51] Int. Cl.$^5$ .............................................. G01R 33/20
[52] U.S. Cl. .................................... 324/309; 324/307
[58] Field of Search ............... 324/300, 309, 307, 314; 128/653.2

[56] References Cited

U.S. PATENT DOCUMENTS

| | | | |
|---|---|---|---|
| 4,965,520 | 10/1990 | Sakamoto | 324/309 |
| 4,982,160 | 1/1991 | Hagiwara | 324/309 |
| 4,983,921 | 1/1991 | Kramer et al. | 324/309 |
| 5,089,784 | 2/1992 | Yoshitome et al. | 324/309 |
| 5,212,448 | 5/1993 | Le Roux et al. | 324/309 |
| 5,229,717 | 7/1993 | Hinks et al. | 324/309 |
| 5,245,282 | 9/1993 | Mugler, III et al. | 324/309 |

OTHER PUBLICATIONS

*Parameter Relations for the Shinner-Le Roux Selective Excitation Pulse Design Algorithm*, Pauly, et al., IEEE Transactions on Medical Imaging, vol. 10 No. 1, Mar. 1991.
*Simplified RF Synthesis*, Society of Magnetic Resonance in Medicine, Eighth Annual Meeting & Exhibition, Aug. 12–18, 1989.
*Multiecho Imaging Sequences with Low Refocusing Flip Angles*, J. Hennig, Journal of Magnetic Resonance 78, 397–407 (1988) (no month).
*Reduction of Non-equilibrium Effect in RARE Sequences*, Glover, et al., SMRM 91 Book of Abstract, San Francisco, Aug., 1991.
RSNA '91, 77th Scientific Assembly & Annual Meeting, Scientific Program, vol. 181 (P), 1991 (no month).

*Primary Examiner*—Michael J. Tokar
*Assistant Examiner*—Raymond Y. Mah
*Attorney, Agent, or Firm*—Quarles & Brady

[57] ABSTRACT

A fast spin echo NMR pulse sequence is modified to stabilize the magnitude of early NMR echo signals produced during each shot. Stabilization is accomplished by modifying the amplitude of the nutation angle produced in the spins by the corresponding RF refocusing pulses. When selective RF refocusing pulses are employed the slice is divided into subslices and the modifications are made separately to each subslice.

2 Claims, 4 Drawing Sheets

STABILIZED FAST SPIN ECHO NMR PULSE SEQUENCE

BACKGROUND OF THE INVENTION

The field of the invention is nuclear magnetic resonance imaging methods and systems. More particularly, the invention relates to the reduction of image artifacts in fast spin-echo (FSE) pulse sequences by producing RF refocusing pulses which stabilize the magnitude of the acquired spin echo signals.

Any nucleus which possesses a magnetic moment attempts to align itself with the direction of the magnetic field in which it is located. In doing so, however, the nucleus processes around this direction at a characteristic angular frequency (Larmor frequency) which is dependent on the strength of the magnetic field and on the properties of the specific nuclear species (the magnetogyric constant $\gamma$ of the nucleus). Nuclei which exhibit this phenomena are referred to herein as "spins".

When a substance such as human tissue is subjected to a uniform magnetic field (polarizing field $B_0$), the individual magnetic moments of the spins in the tissue attempt to align with this polarizing field, but process about it in random order at their characteristic Larmor frequency. A net magnetic moment $M_z$ is produced in the direction of the polarizing field, but the randomly oriented magnetic components in the perpendicular, or transverse, plane (x-y plane) cancel one another. If, however, the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$, which is rotating, or spinning, in the x-y plane at the Larmor frequency. The practical value of this phenomenon resides in the signal which is emitted by the excited spins after the excitation signal $B_1$ is terminated. There are a wide variety of measurement sequences in which this nuclear magnetic resonance ("NMR") phenomena is exploited.

When utilizing NMR to produce images, a technique is employed to obtain NMR signals from specific locations in the subject. Typically, the region which is to be imaged (region of interest) is scanned by a sequence of NMR measurement cycles which vary according to the particular localization method being used. The resulting set of received NMR signals are digitized and processed to reconstruct the image using one of many well known reconstruction techniques. To perform such a scan, it is, of course, necessary to elicit NMR signals from specific locations in the subject. This is accomplished by employing magnetic fields ($G_x$, $G_y$, and $G_z$) which have the same direction as the polarizing field $B_0$, but which have a gradient along the respective x, y and z axes. By controlling the strength of these gradients during each NMR cycle, the spatial distribution of spin excitation can be controlled and the location of the resulting NMR signals can be identified.

The present invention relates particularly to a method of spatial resolution of NMR signals known as slice selection. Slice selection involves the production of so-called "selective" RF excitation pulses in the presence of a magnetic field gradient to restrict the volume of spin excitation to a thin slab, or "slice." The frequency content and the magnitude of the selective RF excitation pulse determines the thickness and profile of the excited slice. The relationship between the selective RF excitation pulse and the spin excitation which results is described by John Pauly, et al. in "Parameter Relations for the Shinnar-Le Roux Selective Excitation Pulse Design Algorithm," published in IEEE Transactions on Medical Imaging, Vol. 10, No. 1, March 1991.

Most NMR scans currently used to produce medical images require many minutes to acquire the necessary data. The reduction of this scan time is an important consideration, since reduced scan time increases patient throughput, improves patient comfort, and improves image quality by reducing motion artifacts.

The concept of acquiring NMR image data in a short time period has been known since 1977 when the echo-planar pulse sequence was proposed by Peter Mansfield (J. Phys. C.10: L55-L58, 1977). In contrast to standard pulse sequences, the echo-planar pulse sequence produces a set of NMR signals for each RF excitation pulse. These NMR signals can be separately phase encoded so that an entire scan of 64 views, for example, can be acquired in a single pulse sequence of 20 to 100 milliseconds in duration. The advantages of echo-planar imaging ("EPI") are well-known, and a number of such sequences have been proposed and are disclosed in U.S. Pat. Nos. 4,678,996; 4,733,188; 4,716,369; 4,355,282; 4,588,948 and 4,752,735.

A variant of the echo planar imaging method is the Rapid Acquisition with Relaxation Enhancement (RARE) sequence which is described by J. Hennig, et al. in an article in *Magnetic Resonance in Medicine* 3,823-833 (1986) entitled "RARE Imaging: A Fast Imaging Method for Clinical MR." The essential difference between the RARE sequence and the EPI sequence lies in the manner in which echo signals are produced. The RARE sequence utilizes RF refocused echoes generated from a Carr-Purcell-Meiboom-Gill sequence, while EPI methods employ gradient recalled echoes.

Both of these "fast spin echo" imaging methods involve the acquisition of multiple spin echo signals from a single excitation pulse in which each acquired echo signal is separately phase encoded. Each pulse sequence, or "shot," therefore results in the acquisition of a plurality of views and a plurality of shots are typically employed to acquire a complete set of image data. For example, a RARE pulse sequence might acquire 8 or 16 separate echo signals, per shot, and an image requiring 256 views would, therefore, require 32 or 16 shots respectively.

It is well known that the RARE sequence, and particularly its slice selective implementation, suffers from a non-steady state behavior in the first NMR echo signals acquired during each shot. This is particularly true when the selective RF refocusing pulses are not exactly 180°. This has led to the inclusion of additional RF refocusing pulses at the beginning of the pulse sequence to allow equilibrium to be achieved before data acquisition begins as proposed by Gary H. Glover, et al. in "Reduction of Non-equilibrium Effects in RARE Sequences," 10th SMRM Proceedings 1991 WIP p. 1242, and RSNA 1991 Book of Abstracts p. 142. While this may reduce image artifacts, it does so with a resulting increase in total scan time.

SUMMARY OF THE INVENTION

The present invention relates to an improved fast spin-echo pulse sequence in which the magnitude of an acquired NMR spin echo signal is stabilized by shaping the RF refocusing pulse which produces it. More particularly, in a fast spin echo pulse sequence one or more RF refocusing pulses are modified by changing their modulation envelope such that the magnitude of the NMR spin-echo signals does not oscillate. In a selective RF refocusing pulse this is accomplished by treating the RF refocus pulse slice profile as a series of subslices which each have a different tip angle and which each must be separately compensated.

A general object of the invention is to compensate the selective RF refocusing pulses in a fast spin echo sequence such that the NMR spin echo signals are stabilized in magnitude. It has been discovered that the amount of instability in the NMR echo signals is a function of the tip angle of the refocusing pulses. At a true 180° tip angle there is no instability, but as the tip angle becomes smaller, the fluctuations in NMR echo signal magnitude increase. It is one discovery of the present invention that for a given echo signal magnitude, the magnitude and phase of the RF refocusing pulses in an FSE pulse sequence can be calculated such that all the resulting NMR spin echo signals may be stabilized. It is a further discovery of the present invention that since a selective RF refocusing pulse actually produces a range of tip angles over the thickness of the slice, then to properly stabilize the NMR spin echo signals produced by such selective RF refocusing pulses, the slice profile may be considered a set of subslices at different tip angles. Accordingly, RF refocusing pulses may be produced to achieve excitation profiles that result in the stabilization of each subslice, and thus result in stabilization of the entire slice.

A general object of the invention is to stabilize the NMR spin echo signals in an FSE pulse sequence without increasing the scan time. No additional pulses need be added to the FSE pulse sequence. Instead, the shape of the RF refocusing pulse envelope is changed on as many of the initial refocusing pulses in the sequence as is necessary to provide the desired degree of stabilization. The modified pulse shapes may be calculated and stored in advance of the scan, and are played out in real time as the scan is conducted in the same manner as unmodified RF refocusing pulses.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DETAILED DESCRIPTION OF THE INVENTION

Figure 1:
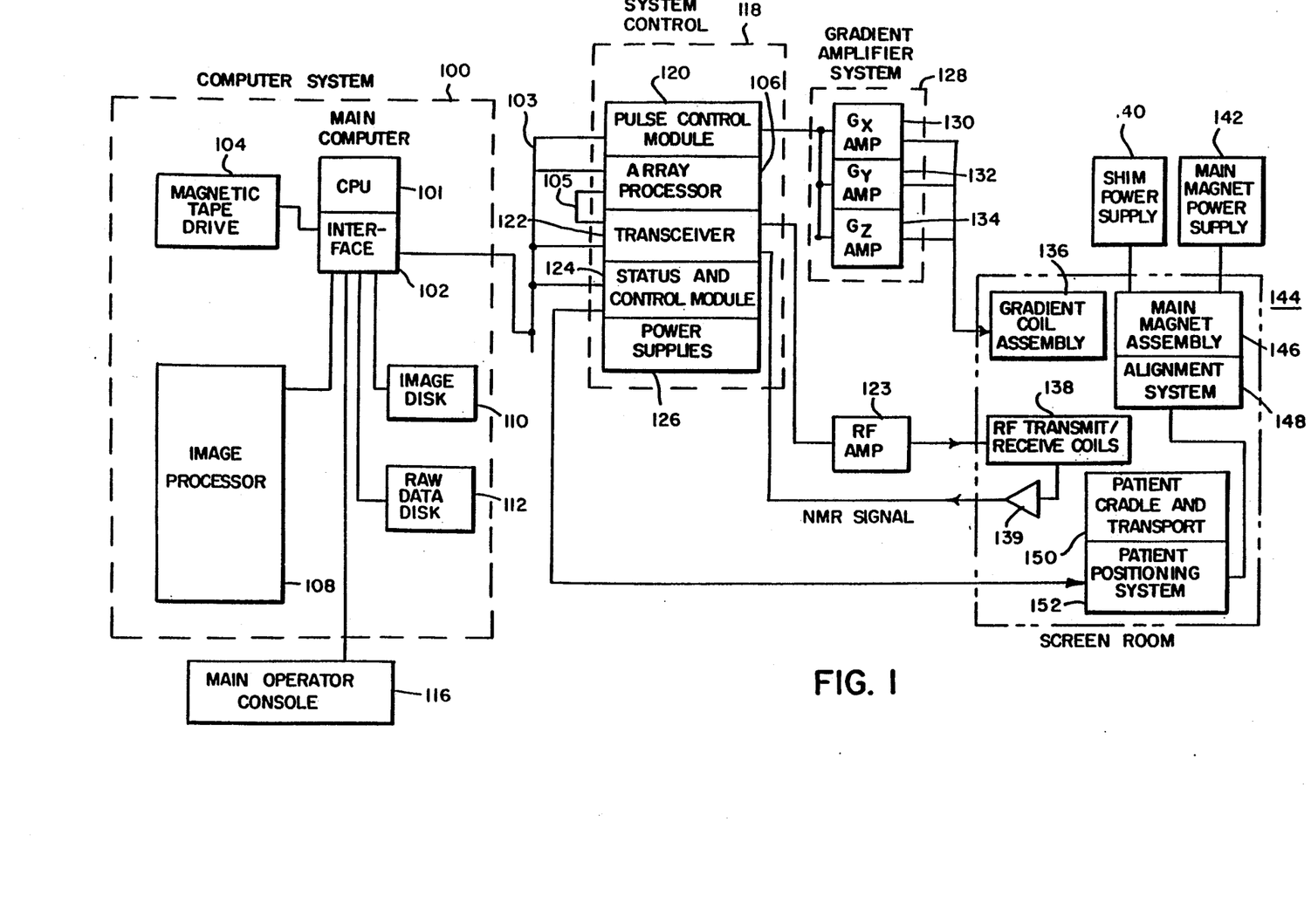
FIG. 1 is a block diagram of an NMR system which employs the present invention.

Referring first to FIG. 1, there is shown in block diagram form the major components of a preferred NMR system which incorporates the present invention and which is sold by the General Electric Company under the trademark "SIGNA". The overall operation of the system is under the control of a host computer system generally designated 100 which includes a main computer 101 (such as a Data General MV7800). The computer has associated therewith an interface 102 through which a plurality of computer peripheral devices and other NMR system components are coupled. Among the computer peripheral devices is a magnetic tape drive 104 which may be utilized under the direction of the main computer for archiving patient data and images to tape. Processed patient data may also be stored in an image disc storage device designated 110. The function of image processor 108 is to provide interactive image display manipulation such as magnification, image comparison, gray-scale adjustment and real-time data display. The computer system is provided with a means to store raw data (i.e. before image construction) utilizing a disc data storage system designated 112. An operator console 116 is also coupled to the computer by means of interface 102 and provides the operator with the means to input data pertinent to a patient study as well as additional data necessary for proper NMR system operation, such as calibrating, initiating and terminating scans. The operator console is also used to display images stored on discs or magnetic tape.

The computer system 100 exercises control over the NMR system by means of system control 118 and gradient amplifier system 128. The computer 100 communicates with system control 118 by means of a link 103 in a manner well known to those skilled in the art. The system control 118 includes several subsystems such as a pulse control module (PCM) 120, an array processor 106, a radio frequency transceiver 122, a status and control module (SCM) 124, and the power supplies generally designated 126 necessary to energize the components. The PCM 120 utilizes control signals provided by main computer 101 to generate digital timing and control signals such as the digital waveforms which control gradient coil excitation, as well as RF envelope waveforms utilized in the transceiver 122 for modulating the RF excitation pulses. The gradient waveforms are applied to the gradient amplifier system 128 generally comprised of $G_x$, $G_y$ and $G_z$ amplifiers 130, 132 and 134, respectively. Each amplifier 130, 132 and 134 is utilized to excite a corresponding gradient coil in an assembly generally designated 136. When energized, the gradient coils generate magnetic field gradients $G_x$, $G_y$ and $G_z$ of the magnetic field in the same direction as the main polarizing magnetic field, wherein the gradients are directed in mutually orthogonal X-, Y- and Z-axis directions of a Cartesian coordinate system. That is, if the magnetic field generated by the main magnet (not shown) is directed in the z direction and is termed $B_0$, and the total magnetic field in the z direction is referred to as $B_z$, then $G_x = \partial B_z/\partial x$, $G_y = \partial B_z/\partial y$ and $G_z = \partial B_z/\partial z$, and the magnetic field at any point (x, y, z) is given by $B(x, y, z) = B_0 + G_x X + G_y Y + G_z Z$.

The gradient magnetic fields are utilized in combination with radio frequency pulses generated by transceiver 122, RF amp 123 and RF coil 138 to encode spatial information into the NMR signals emanating from the region of the patient being studied. Waveforms and control signals provided by the pulse control module 120 are utilized by the transceiver subsystem 122 for RF carrier modulation and mode control. In the transmit mode, the transmitter provides a radio frequency waveform modulated in accordance with the control signals to an RF power amplifier 123 which then energizes RF coil 138 which is situated within main magnet assembly 146. The NMR signals radiated by the excited nuclei in the patient are sensed by the same or a different RF coil than is used for transmitting and amplified by a preamplifier 139. The NMR signals are amplified, demodulated, filtered, and digitized in the receiver section of the transceiver 122. The processed NMR signals are transmitted to the array processor 106 for processing by means of a dedicated, unidirectional link 105.

The PCM 120 and SCM 124 are independent subsystems both of which communicate with main computer 101, peripheral system, such as patient positioning system 152, as well as to one another by means of serial communications link 103. The PCM 120 and SCM 124 are each comprised of a 16-bit microprocessor (such as Intel 80286) for processing commands from the main computer 101. The SCM 124 includes means for acquiring information regarding patient cradle position, and the position of the moveable patient alignment light fan beam (not shown). This information is used by main computer 101 to modify image display and reconstruction parameters. The SCM 124 also initiates functions such as actuation of the patient transport and alignment systems.

The gradient coil assembly 136 and the RF transmit and receiver coils 138 are mounted within the bore of the magnet utilized to produce the polarizing magnetic field. The magnet forms a part of the main magnet assembly which includes the patient alignment system 148. A shim power supply 140 is utilized to energize a shim coil associated with the main magnet and which are used to correct inhomogeneities in the polarizing magnet field. In the case of a superconductive magnet, the main power supply 142 is utilized to bring the polarizing field produced by the magnet to the proper operating strength and is then disconnected. The patient alignment system 148 operates in combination with a patient cradle and transport system 150 and patient positioning system 152. To minimize interference from external sources, these NMR system components are enclosed in an RF-shielded room generally designated 144.

Figure 2:
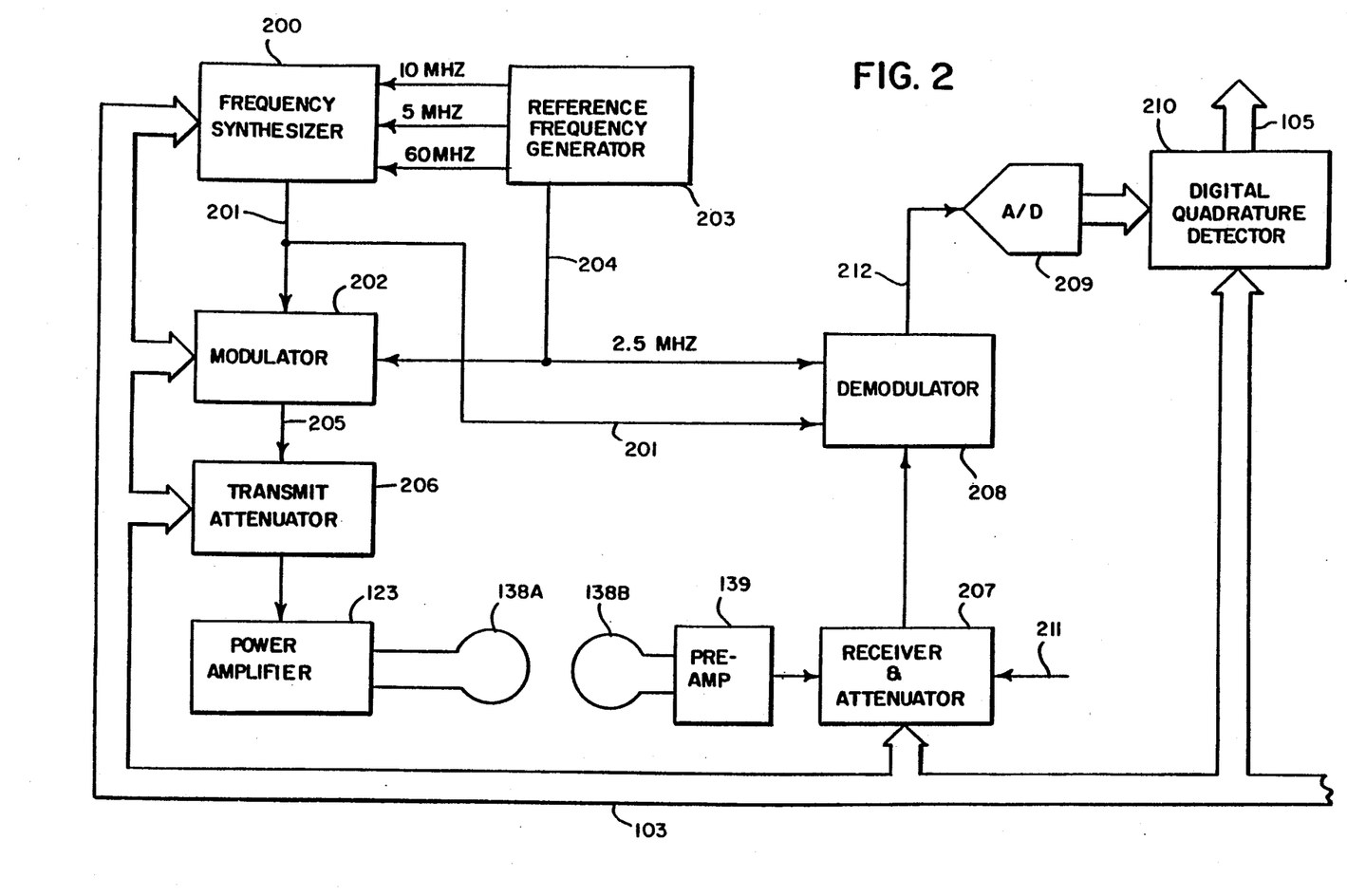
FIG. 2 is an electrical block diagram of the transceiver which forms part of the NMR system of FIG. 1.

Referring particularly to FIGS. 1 and 2, the transceiver 22 includes components which produce the RF excitation field $B_1$ through power amplifier 123 at a coil 138A and components which receive the resulting NMR signal induced in a coil 138B. The base, or carrier, frequency of the RF excitation field is produced under control of a frequency synthesizer 200 which receives a set of digital signals (CF) through the communications link 103 from the main computer 101. These digital signals indicate the frequency and phase of the RF carrier signal which is produced at an output 201. The commanded RF Carrier is applied to a modulator 202 where it is modulated in response to a signal R(t) received through the link 103 from the PCM 120. The signal R(t) defines the envelope, and therefore the bandwidth, of the RF excitation pulse to be produced. It is produced in the PCM 120 by sequentially reading out a series of stored digital values as the RF excitation pulse is produced that represent the desired envelope. These stored digital values may, in turn, be changed by the computer 100 to enable any desired RF pulse envelope to be produced. The magnitude of the RF excitation pulse output through line 205 is attenuated by a transmit attenuator circuit 206 which receives a digital signal, TA, from the main computer 101 through communications link 103. The attenuated RF excitation pulses are applied to the power amplifier 123 that drives the RF transmitter coil 138A. For a more detailed description of this portion of the transceiver 122, reference is made to U.S. Pat. No. 4,952,877 which is incorporated herein by reference.

Referring still to FIGS. 1 and 2 the NMR signal produced by the subject is picked up by the receiver coil 138B and applied to the input of a receiver 207. The receiver 207 amplifies the NMR signal and this is attenuated by an amount determined by a digital attenuation signal (RA) received from the main computer 101 through link 103. The receiver 207 is also turned on and off by a signal through line 211 from the PCM 120 such that the NMR signal is acquired only over the time intervals required by the particular acquisition being performed.

The received NMR signal is at or around the Larmor frequency, which in the preferred embodiment is around 63.86 MHz. This high frequency signal is demodulated in a two step process in a demodulator 208 which first mixes the NMR signal with the carrier signal on line 201 and then mixes the resulting difference signal with the 2.5 MHz reference signal on line 204. The resulting demodulated NMR signal on line 212 has a bandwidth of 125 kHz and it is centered at a frequency of 187.5 kHz. The demodulated NMR signal is applied to the input of an analog-to-digital (A/D) converter 209 which samples and digitizes the analog signal at a rate of 250 kHz. The output of the A/D converter 209 is applied to a digital quadrature detector 210 which produces 16-bit in-phase (I) values and 16-bit quadrature (Q) values corresponding to the received digital signal. The resulting stream of digitized I and Q values of the received NMR signal is output through bus 105 to the array processor where they are employed to reconstruct an image.

To preserve the phase information contained in the received NMR signal, both the modulator 202 in the transmitter section and the demodulator 208 in the receiver section are operated with common signals. More particularly, the carrier signal at the output 201 of the frequency synthesizer 200 and the 2.5 MHz reference signal at the output 204 of the reference frequency generator 203 are employed in both the modulation and the demodulation process. Phase consistency is thus maintained and phase changes in the demodulated received NMR signal accurately indicate phase changes produced by the excited spins. The 2.5 MHz reference signal as well as 5, 10 and 60 MHz reference signals are produced by the reference frequency generator 203 from a common 10 MHz clock signal, and the latter three reference signals are employed by the frequency synthesizer 200 to produce the carrier signal on output 201. For a more detailed description of the receiver, reference is made to U.S. Pat. No. 4,992,736 which is incorporated herein by reference.

Figure 3:
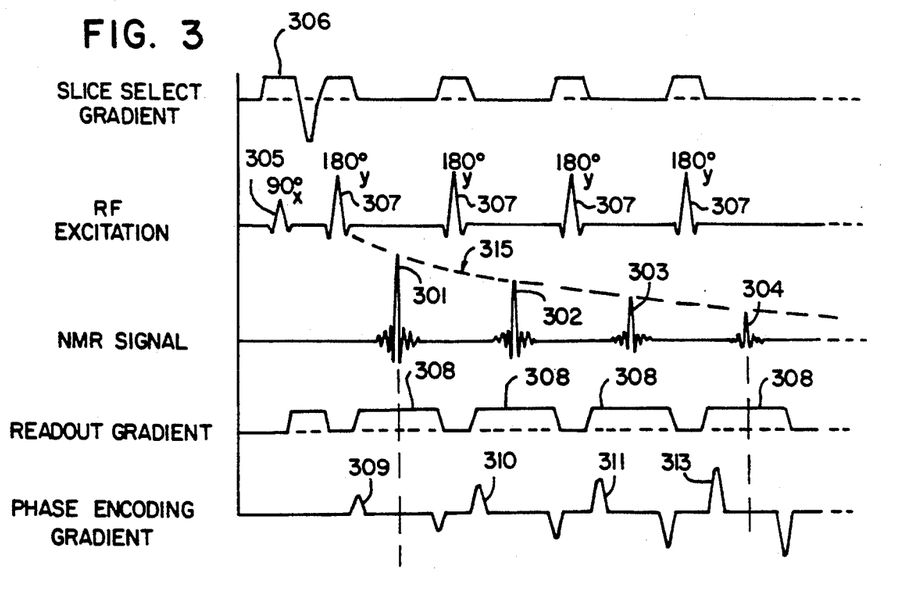
FIG. 3 is a graphic representation of a fast spin-echo pulse sequence.

Referring particularly to FIG. 3, a conventional fast spin echo NMR pulse sequence, known as a 2DFT RARE sequence is shown. For clarity, only four echo signals 301-304 are shown in FIG. 3, but it can be appreciated that more are produced and acquired. These NMR echo signals are produced by a 90° RF excitation pulse 305 which is generated in the presence of a $G_z$ slice select gradient pulse 306 to provide transverse magnetization in a slice through the patient. This transverse magnetization is refocused by each selective RF refocusing pulse 307 to produce the NMR spin echo signals 301-304 that are acquired in the presence of $G_x$ readout gradient pulses 308. Each NMR spin echo signal 301-304 is separately phase encoded by respective $G_y$ phase encoding pulses 309-313. The magnitude of each phase encoding pulse is different, and it is stepped through 256 values to acquire 256 separate views during a complete scan. This enables an image having 256 separate pixels in the y direction to be reconstructed. Each NMR spin echo signal is acquired by digitizing 256 samples of each signal. As a result, at the completion of a scan for one image, 16 shots (256/16=16) of the pulse sequence of FIG. 3 have been executed and a 256 by 256 element array of complex numbers have been acquired. An 2D image is reconstructed by performing a 2D Fourier transformation on this image data array and then calculating the absolute value of each resulting complex element. A 256 by 256 pixel image is thus produced in which the brightness of each pixel is determined by the magnitude of its corresponding element in the transformed array.

Referring still to FIG. 3, the $T_2$ decay in the NMR spin echo signals 301-304 is illustrated by the dashed line 315. The rate of decay is different for different tissue types and a common strategy in FSE NMR imaging is to enhance the contrast in certain tissues over other tissues by judiciously selecting an effective echo time. This effective echo time is determined primarily by the actual echo time (TE) of the central, or low-order, views that dominate image contrast. For example, to enhance muscle tissue in the image of a human knee joint, the first spin echo signals may be encoded to a low-order phase encoding value in each shot because the $T_2$ decay rate of muscle tissue is high and the shortest possible effective echo time (TE) is desired. On the other hand, to produce an image in which the fluids in the knee joint are enhanced, the low-order phase encoding views may be acquired from later echo signals which have a much longer echo time TE. The $T_2$ decay rate of joint fluids is much less than that of muscle tissue, and as a result, these fluids will contribute proportionately more signal and their contrast will be enhanced in comparison with that of muscle tissue.

Figure 4:
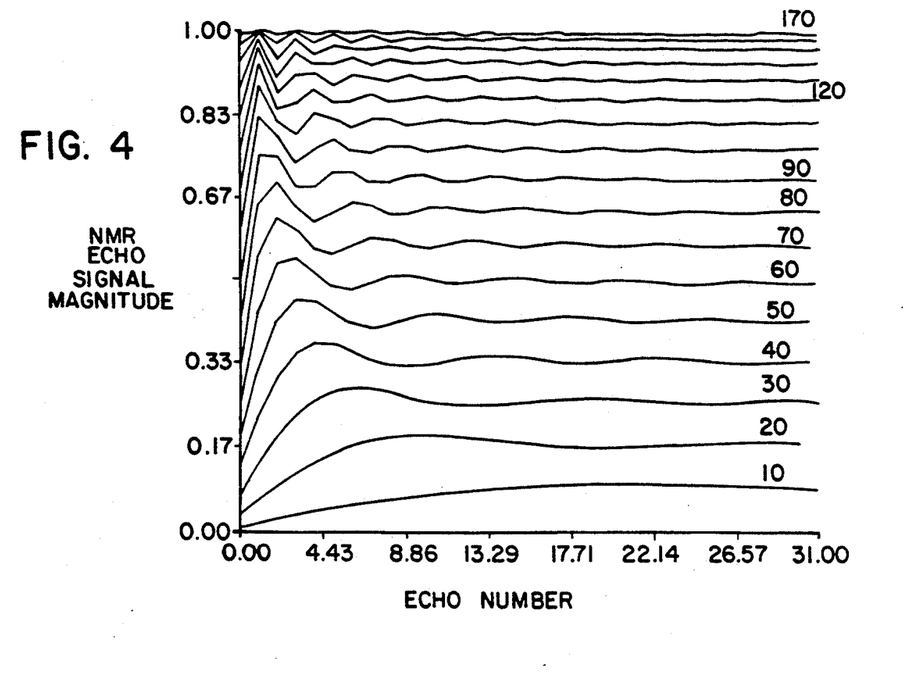
FIG. 4 is a graphic representation of the NMR echo signal magnitude variations as a function of echo number and tip angle.

With the conventional FSE pulse sequence, the NMR echo signals 301-304 do not decay smoothly along the dashed line 315. Instead, the magnitude of the NMR signals 301-305 may oscillate significantly below this optimal $T_2$ decay curve 315, particularly during the early NMR echo signals. This is illustrated in FIG. 4, where $T_2$ is assumed to be very large, the vertical axis is NMR echo signal strength, and the horizontal axis is the number of the NMR echo signal in the shot. Each line represents the magnitude of the NMR echo signals produced by RF refocusing pulses having the indicated constant tip angle. The figure illustrates tip angles from $\theta = 10°$ to $\theta = 170°$, and it should be apparent from these that the signal level variation problem does not arise when perfect 180° RF refocusing pulses are produced. Instead, as the tip angle is reduced below 180°, the oscillations in the early NMR echo signal magnitudes become very significant even at tip angles marginally less than 180°. As the tip angle is further decreased, more NMR echo signals are affected before an equilibrium condition is reached, but the oscillations become less pronounced.

Figure 5:
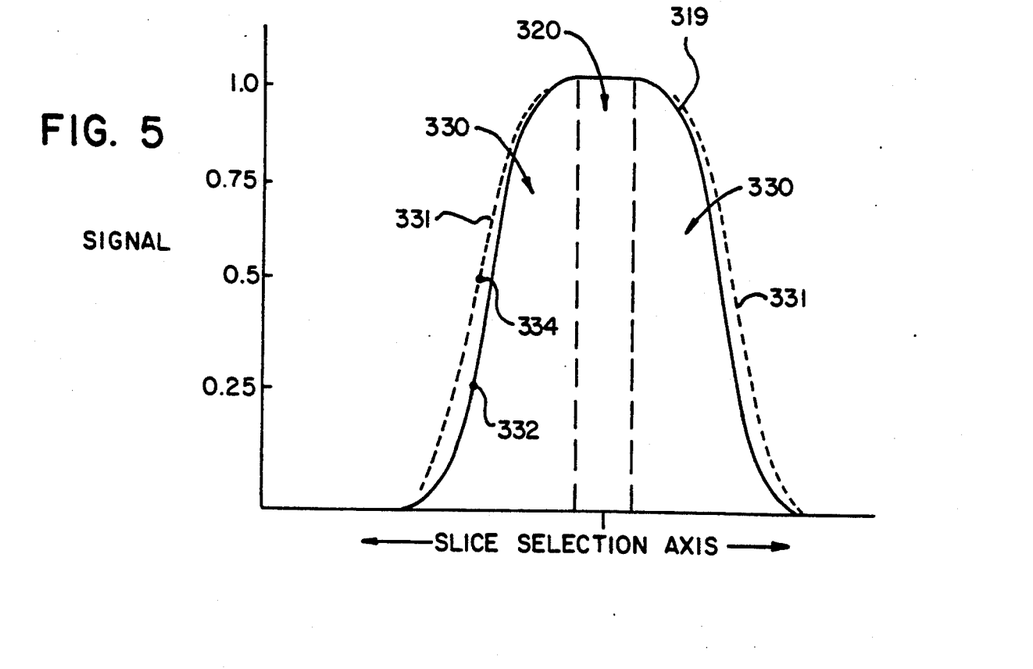
FIG. 5 is a graphic representation of the excitation profile in a typical slice select pulse sequence.

The difficulty arises because the RF refocusing pulses are slice selective. As shown in FIG. 5, a slice profile 319 of such a slice selective RF pulse may impart a tip angle of 180° to the spins in a central region 320 of the selected slice, but decreasing tip angles are imparted to the spins located near each of its edges. Thus, the spins in the central region 320 will produce NMR echo signal components of relatively constant magnitude, while the remaining spins will produce NMR echo signal components that oscillate in different patterns as a function of their tip angle and the corresponding curves in FIG. 4. It is an objective of the present invention to produce selective RF refocusing pulses which will eliminate such oscillations in the NMR echo signals for all spins in the excited slice.

First we consider the case in which a non-selective RF refocusing pulse is used and all spins experience the same RF excitation and refocusing flip angles. If the flip angle $\theta_i$ of each refocusing pulse is known, the output signal magnitude for each signal can be calculated using the Bloch equations as described by J. Hennig in "Multiecho Imaging Sequences With Low Refocusing Flip Angles," *Journal of Magnetic Resonance*, 78, 397-407 (1988). The solution to the present problem is the inverse — for each steady state NMR echo signal $S_i$ determine the required RF refocusing pulse flip angle $\theta_i$. The result is a unique sequence of nutation angles $\theta_i$ that will produce a stabilized echo signal output S.

More specifically, the Bloch equations permit the recursive calculation of echo signal amplitude $S_i$ when the refocusing pulse nutation angle $\theta_i$ is known:

$$\begin{cases} Q_i = 2c_i s_i P_{i-1} + c_i^2 Z^{-1} Q_{i-1} + s_i^2 Q_{i-1}^* \\ P_i = (c_i^2 - s_i^2) P_{i-1} - c_i s_i Z^{-1} Q_{i-1} + c_i s_i Q_{i-1}^* \end{cases} \quad (1)$$

with:

$$\begin{cases} Q_{-1} = 1 \\ P_{-1} = 0 \end{cases}$$

where:

$c_i = \cos\theta_i/2$
$s_i = \sin\theta_i/2$
$i =$ the refocusing pulse number
$Q_i, P_i$ are polynomials in $Z$ and $Z^{-1}$ and with real coefficients:

$$Q_i(\omega) = q^i_{-i} Z^i + \ldots q^i_{-1} Z + q^i_0 + q^i_1 Z^{-1} \ldots + q^i_{i+1} Z^{-i-1}$$

$$P_i(\omega) = p^i_{-i} Z^i + \ldots p^i_{-1} Z + p^i_0 + p^i_1 Z^{-1} \ldots + p^i_{i+1} Z^{-i-1} \quad (2)$$

And the echo signal $S_i$ is found from the zero order coefficient of the polynomials $Q_i$ by:

$$S_i = j q^i_0 \quad (3)$$

The inverse problem of finding a sequence of nutation angles $\theta_i$ which maintain a constant echo signal magnitude S has the following unique solution:

$$t_i = \tan(\theta_i/2) = \frac{S - q_{-1}^{i-1}}{2p_0^{i-1}} \quad (4)$$

This expression, coupled with the recursion expressed above in equation (1) generates a sequence of nutation angles $\theta_i$ which will maintain a constant, or stabilized, series of echo signals S. Appendix A is a listing of a C language program which produces values of $t_i$ using the above equations (1) and (4). The desired nutation angles $\theta_i$ are then calculated as follows:

$$s_i = t_i/\sqrt{1 + t_i^2} \quad (5)$$

$$\theta_i = 2\sin^{-1}(s_i)$$

Rather than solving equations (1) and (4) recursively, values for $t_i$ can be calculated directly for the first few echo signals according to the following equations for the desired echo signal amplitude S:

$$t_0 = \sqrt{\frac{S}{1-S}} \quad \text{or} \quad s_0 = \sqrt{S}$$

$$t_1 = \frac{1}{2}\sqrt{\frac{S}{1-S}} \quad \text{or} \quad s_1 = \sqrt{\frac{S}{4-3S}}$$

$$t_2 = \frac{1}{2}\sqrt{\frac{S}{1-S}} \cdot \frac{3-2S}{4-3S}$$

$$t_3 = \frac{1}{2}\sqrt{\frac{S}{1-S}}\left[1 - \frac{\frac{1}{2-S}}{1 - \frac{S(1-S)(7-5S)}{(4-3S)^2}}\right]$$

Figure 6:
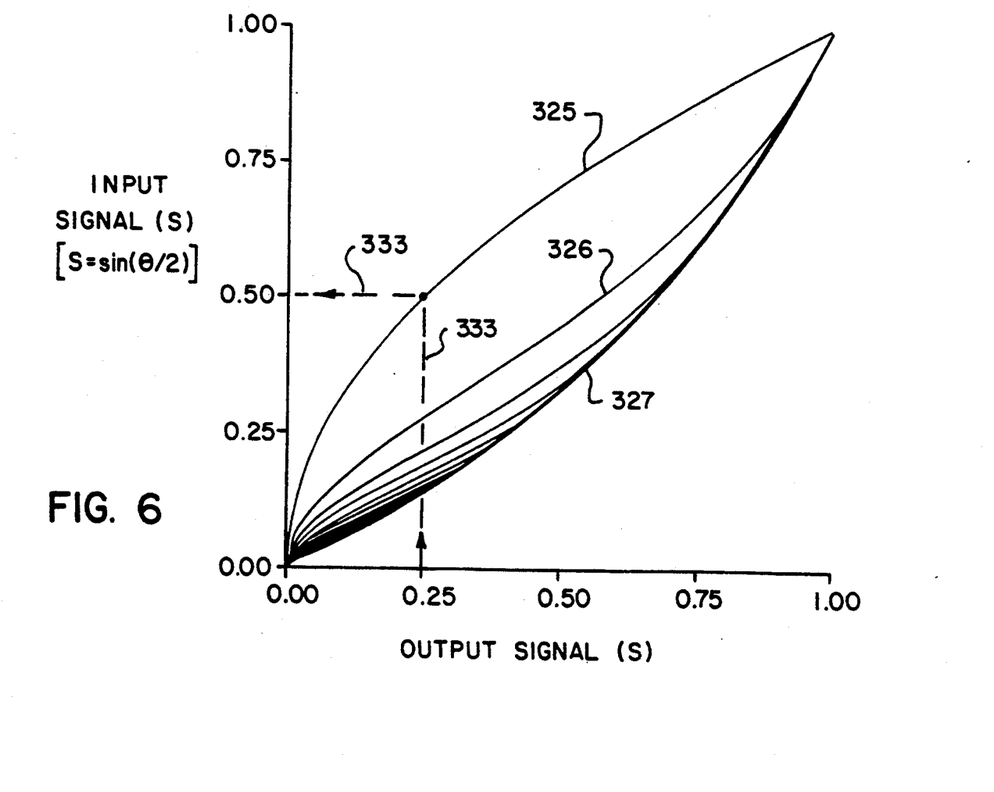
FIG. 6 is a graphic representation of the RF refocusing pulse magnitude required for each RF refocusing pulse in the FSE pulse sequence of FIG. 3 to provide stabilized NMR echo signals according to the present invention.

These analytical expressions for $t_i$ become increasingly difficult to find, but the values for the desired input signals $s_i$ can be tabulated as a function of the desired output signals (S) to produce a set of smooth curves as shown in FIG. 6.

Referring particularly to FIG. 6, the horizontal axis is the desired output signal magnitude (S), and the vertical axis is the amplitude of the RF refocusing pulse (s). To design a train of stabilized signals, a desired output signal (S) is picked and a vertical line is drawn from that point on the horizontal axis. Where that vertical line intersects the leftmost curve 325, a line is drawn horizontally to the vertical axis which indicates the required amplitude (s) of the first RF refocusing pulse. Similarly, where the vertical line intersects the second leftmost curve 326, the vertical axis indicates the required amplitude of the second RF refocusing pulse to produce stabilized NMR echo signals. The process is repeated for subsequent echo signals in the train. It should be apparent from the graphs in FIG. 6 that the curves for each echo all converge on the same curve 327 as a function of higher amplitudes (i.e. nutation angles) and higher echo numbers. The number of echo signals to be stabilized will depend on the particular situation and may range from one echo signal where only high nutation angles are involved, to as many as ten echo signals where low nutation angles are involved.

These stabilization graphs can be used, for example, to design RF refocusing pulses where reduced nutation angles (for example 130°) are used in lieu of the conventional 180° refocusing pulses. Such RF refocusing pulses are used, for example, where the duration of the refocusing pulse is shortened to reduce overall scan time and its amplitude must, therefore, be increased and may exceed the patient SAR limit. The present invention enables one to use such reduced nutation refocusing pulses without paying a severe price in echo signal magnitude variations.

However, as indicated above, the present invention is also applicable where selective 180° RF refocusing pulses are employed in the FSE sequence. Referring again to FIG. 5, in a conventional slice select profile 319 a slab of spins over a region indicated as subslice 320 is excited at the desired 180° nutation angle. However, this is not true in the transition regions 330 on each edge of this central subslice 320. Instead, these transition regions 330 can be viewed as a set of separate subslices having separate tip angles. Unless stabilized, the spins in these transition regions 330 will produce NMR signal components which vary in amplitude quite significantly during the early portion of each FSE shot. The contribution which these transition spins make to the total NMR echo signal will vary as a function of slice thickness and slice profile, however, it is a significant amount and the resulting echo signals will oscillate in magnitude.

It is a teaching of the present invention that the selected slice should be viewed as a set of subslices, and the echo signals produced by each subslice should be stabilized as described above.

For each of the subslices in the slice profile of FIG. 5, the graph in FIG. 6 is employed to determine the RF signal strength (s) required to produce stabilized NMR echo signals. In other words, for each echo signal in the shot the points (S) on the slice profile 319 of FIG. 5 are mapped through the appropriate curve in FIG. 6 to produce corresponding points (s) on a stabilized slice profile such as that shown by the dotted line 331 in FIG. 5. For example, for the first echo signal the RF refocusing pulse profile point 332 is mapped through the curve 325 in FIG. 6 as indicated by dashed lines 333. The resulting input signal (s) is indicated by the point 334 on the stabilized slice profile 331. This process is repeated for each point on the slice profile 319 to produce the stabilized slice profile 331. The process may then be repeated for the second and subsequent echo signals in the shot by mapping through the corresponding curves in FIG. 6.

Using the stabilized slice profiles for each RF refocusing pulse and the SLR algorithm described by John Pauly, et al. in "Parameter Relations for the Shinnar-Le Roux Selective Excitation Pulse Design Algorithm," *IEEE Transactions on Medical Imaging*, Vol. 10, No. 1, March 1991, the RF refocusing pulse waveform needed to produce each stabilized NMR echo signal can be calculated. The resulting waveforms are stored in the PCM 120 (FIG. 1) and are played out as the above-described signal R(t) which controls the RF waveform during the production of the RF refocusing pulses 307 by the transceiver 122.

Appendix A

```
/* __________________________________________ */
/* necho is the number of echoes to stabilize */
/* at a given signal level 0<S<1              */
/* __________________________________________ */ n = necho-1;
    ndim = 2*n + 2;  /* arrays dimension   */
    izero = n;       /* position of index 0 */
                     /* in their arrays     */

/* __________________________________________ */
/* we need 4 real arrays p,q and p1,q1        */
/* the last ones being just buffers           */
/* to simplify the recursion implementation   */
/* __________________________________________ */ for (i=0; i<ndim; i++)
{
   p[i] =0;
   q[i] =0;
}
q[izero] = 1;

t = sqrt (S/(1-S));  /* initialize t0        */
                     /* for echo amplitude = s */ for (iecho =0; iecho < necho; iecho++)
{
   s[iecho] = t/sqrt(1+t*t); /* sn from tn, save it */
   for (L=-iecho; L<=iecho+1; L++)
   {
       /*L: index of coefficient of Q           */
     k = izero+L;
     j = izero-L;
     p1[k] = (1-tn*tn) * p[k]+ tn*q[j]-tn * q[k-1];
     q1[k] = 2*tn*p[k] + tn*tn*q[j]+ q[k-1];
   }
   c = 1.0/(1.0+t*t);
   for (L=-iecho; L<=iecho+1; L++)
```

```
    {
        k = izero + L;
        p[k] = c2*p1[k];
        q[k] = c2*q1[k];
    } t = 0.5*(S-q[izero-1])/(p[izero]+0.00000001);
    /* the next pulse tangent for stabilization
}
/* ______________________________________________ */
/* as output the array s[0..necho-1] are related */
/* to the nutation angle of each rephasing pulse */
/* by s = sin(teta/2)                            */
/* ______________________________________________ */
```

We claim:

1. An NMR system, the combination comprising:
   means for generating a polarizing magnetic field;
   excitation means for generating an RF excitation magnetic field which produces transverse magnetization in spins subjected to the polarizing magnetic field;
   receiving means for sensing an NMR signal produced by the transverse magnetization and producing digitized samples of the NMR signal;
   first gradient means for generating a first magnetic field gradient to phase encode the NMR signal;
   second gradient means for generating a second magnetic field gradient to frequency encode the NMR signal;
   pulse control means coupled to the excitation means, first gradient means, second gradient means, receiver means, said pulse control means being operable to conduct a fast spin echo pulse sequence in which a series of NMR echo signals are produced in response to a single RF excitation pulse followed by a corresponding series of RF refocusing pulses produced by said excitation means, and in which said NMR echo signals are stabilized to a substantially smoothly decaying amplitude by altering the flip angle produced by one or more of the initial RF refocusing pulses in said series.

2. An NMR system, the combination comprising:
   means for generating a polarizing magnetic field;
   excitation means for generating an RF excitation magnetic field which produces transverse magnetization in spins subjected to the polarizing magnetic field;
   receiving means for sensing an NMR signal produced by the transverse magnetization and producing digitized samples of the NMR signal;
   first gradient means for generating a first magnetic field gradient to phase encode the NMR signal;
   second gradient means for generating a second magnetic field gradient to frequency encode the NMR signal; and
   third gradient means for generating a third magnetic field gradient to select a slice of said spins comprised of a plurality of adjacent subslices of said spins which are transversely magnetized by said excitation means; and
   pulse control means coupled to the excitation means, first gradient means, second gradient means, third gradient means and receiver means, said pulse control means being operable to conduct a fast spin echo pulse sequence in which a series of NMR echo signals are produced in response to a single RF excitation pulse followed by a corresponding series of selective RF refocusing pulses produced by said excitation means concurrently with corresponding slice select pulses produced by said third gradient means, and in which said NMR echo signals are stabilized to a substantially smoothly decaying amplitude by altering the flip angle produced by said selective RF refocusing pulses for one or more subslice components.

* * * * *